United States Patent
Kuttner

(10) Patent No.: US 8,111,182 B2
(45) Date of Patent: Feb. 7, 2012

(54) DIGITAL TO ANALOG CONVERTER COMPRISING MIXER

(75) Inventor: Franz Kuttner, St. Ulrich (AT)

(73) Assignee: Infineon Technologies AG, Neubiberg (DE)

(*) Notice: Subject to any disclaimer, the term of this patent is extended or adjusted under 35 U.S.C. 154(b) by 164 days.

(21) Appl. No.: 12/578,301

(22) Filed: Oct. 13, 2009

(65) Prior Publication Data

US 2011/0085616 A1   Apr. 14, 2011

(51) Int. Cl.
*H03M 1/66* (2006.01)
(52) U.S. Cl. .................. 341/144; 375/295; 455/112
(58) Field of Classification Search .................. 341/144; 375/295–300, 316; 455/115.1, 120, 67.11
See application file for complete search history.

(56) References Cited

U.S. PATENT DOCUMENTS

| | | | |
|---|---|---|---|
| 6,124,813 A * | 9/2000 | Robertson et al. ............ 341/143 |
| 6,763,227 B2 * | 7/2004 | Kramer ...................... 455/115.1 |
| 6,831,582 B2 | 12/2004 | Kuttner et al. |
| 7,113,119 B2 * | 9/2006 | Van Veldhoven et al. .... 341/143 |
| 7,277,689 B2 * | 10/2007 | Simon ........................... 455/323 |
| 7,345,612 B2 * | 3/2008 | Eloranta et al. ............... 341/153 |
| 7,421,037 B2 * | 9/2008 | Shakeshaft et al. ........... 375/295 |
| 7,424,067 B2 * | 9/2008 | Vanderperren et al. ....... 375/326 |
| 7,483,687 B2 * | 1/2009 | Carrez .......................... 455/318 |
| 7,558,538 B2 * | 7/2009 | Carrez .......................... 455/112 |
| 7,746,258 B2 * | 6/2010 | Park .............................. 341/144 |
| 7,773,969 B2 * | 8/2010 | Simon ........................... 455/333 |
| 7,944,381 B2 * | 5/2011 | Kuttner ........................ 341/136 |
| 2005/0190846 A1 * | 9/2005 | Smaini et al. ................. 375/247 |
| 2008/0132189 A1 | 6/2008 | Maxim et al. |
| 2008/0224908 A1 | 9/2008 | Li et al. |

* cited by examiner

*Primary Examiner* — Lam T Mai
(74) *Attorney, Agent, or Firm* — SpryIP, LLC

(57) ABSTRACT

In some embodiments, digital to analog converters are provided which comprise a plurality of cells. Each cell comprises a mixer and coupling circuitry to selectively couple a local oscillator signal to said mixer.

25 Claims, 4 Drawing Sheets

DIGITAL TO ANALOG CONVERTER COMPRISING MIXER

BACKGROUND OF THE INVENTION

The present invention relates to digital to analog converters comprising a mixer.

In some applications, signals are processed digitally, converted to analog signals and then mixed with a local oscillator signal to obtain a signal with a desired frequency. An example for such an application are wireless transmitters, where signals are processed digitally at a so-called baseband frequency, converted to an analog signal via a digital to analog converter (DAC) and mixed with a radio frequency signal to obtain a radio frequency transmit signal, which is then transmitted via an antenna.

With some structures used for this purpose, so-called local oscillator (LO) leakage occurs, which is the power of the frequency of the local oscillator signal when a signal output by the digital to analog converter is at zero, or in other words the digital signal input to the digital to analog converter indicates a zero, in comparison to the signal when the output of the to analog converter assumes its maximum value.

SUMMARY OF THE INVENTION

According to an embodiment, a digital to analog converter is provided, comprising: a digital signal input, a plurality of cells, each cell comprising a mixer, and coupling circuitry configured to selectively couple a local oscillator signal to each of said mixers based on a signal at said digital signal input.

It should be noted that the above summary is only intended to give a brief overview over some features of an embodiment of the present invention and is not to be construed as limiting. In particular, other embodiments may comprise different features, less features, more features and/or alternative features.

BRIEF DESCRIPTION OF THE SEVERAL VIEWS OF THE DRAWING(S)

DETAILED DESCRIPTION OF THE INVENTION

Figure 1:
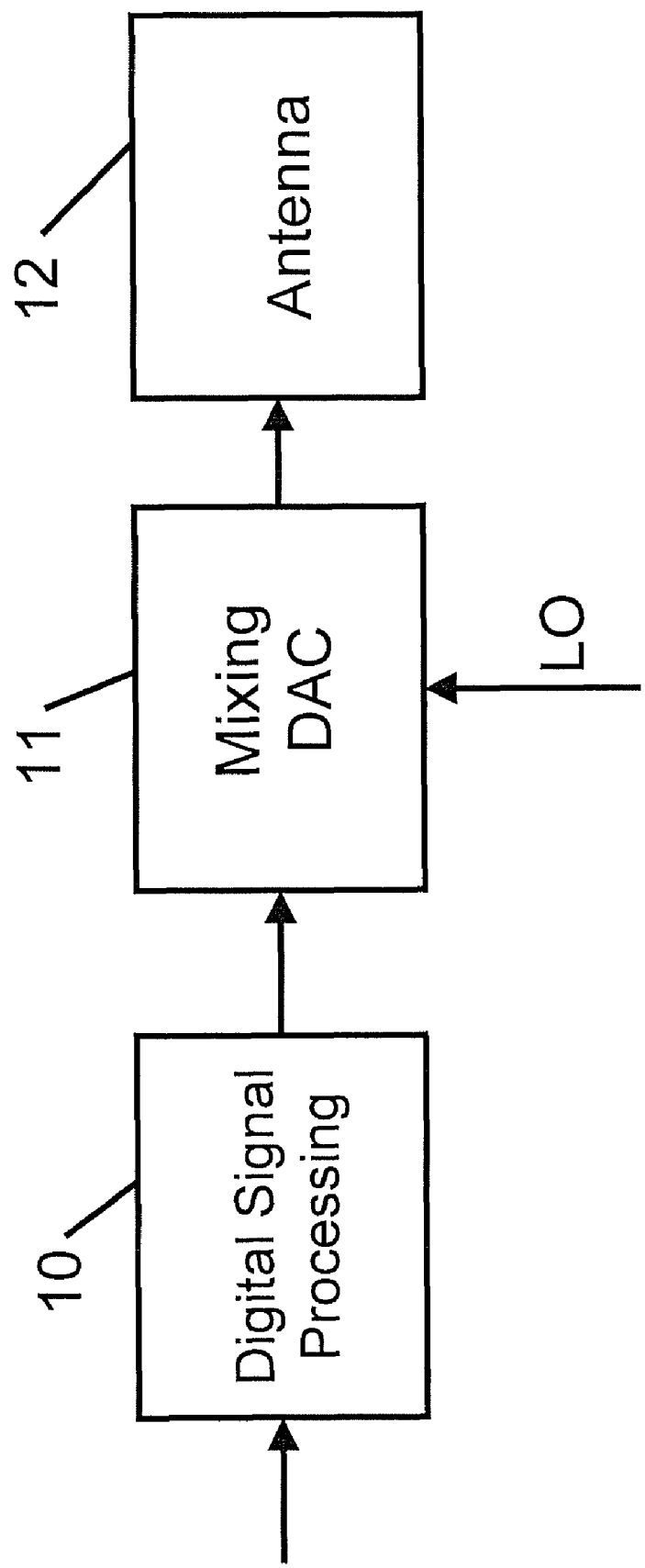
FIG. 1 shows a block diagram of a transmitter according to an embodiment.

In the following, some embodiments of the present invention will be described in detail. It is to be understood that the following description is given only for the purpose of illustration and is not to be taken in a limiting sense. The scope of the invention is not intended to be limited by the embodiment described hereinafter with reference to the accompanying drawings, but is intended to be limited only by the appended claims and equivalents thereof.

It is also to be understood that in the following description of embodiments any direct connection or coupling between functional blocks, devices, components, circuit elements or other physical or functional units shown in the drawings or described herein could also be implemented by an indirect connection or coupling, i.e., a connection or coupling comprising one or more intervening elements. Furthermore, it should be appreciated that functional blocks or units shown in the drawings may be implemented as separate circuits in some embodiments, but may also be fully or partially implemented in a common circuit or common integrated circuit in other embodiments, or in some cases may also be implemented jointly by programming a processor accordingly.

It should be noted that the drawings are provided to give an illustration of some aspects and features of embodiments of the present invention and are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components and elements shown.

The features of the various embodiments described herein may be combined with each other unless specifically noted otherwise. On the other hand, describing an embodiment with a plurality of features is not to be construed as indicating that all those features are necessary for practising the present invention, as other embodiments may comprise less features and/or alternative features.

In some of the following embodiments, digital to analog converters (DACs) will be described. DACs generally are entities which convert a digital signal into an analog signal. Digital signals generally comprise a number of bits, where the number of bits determines the range of values which may be represented by the digital signal. Analog signals may be either voltage signals, also referred to as signals in the voltage domain, or current signals, also referred to as signals in the current domain. For voltage signals, the voltage corresponds to the value of the signal, whereas for current signals, the current corresponds to the value of the signal.

In some of the embodiments described hereinafter, digital to analog converters are described as comprising a plurality of cells. A cell generally refers to a portion to a digital to analog converter which generates a part of the output signal thereof. The overall output signal of the digital to analog converter then is based on the output signals of all cells of the digital to analog converter.

Turning now to the figures, in FIG. 1 a simplified block diagram of a wireless transmitter according to an embodiment of the present invention is shown. The wireless transmitter of FIG. 1 is an example for an application where digital to analog converters comprising mixers according to embodiments of the present invention may be employed. However, the use of such digital to analog converters comprising mixers is not limited to the application of wireless transmitters.

The embodiment of FIG. 1 comprises digital signal processing circuitry pen, for example a digital signal processor, where signals to be transmitted are processed digitally. These signals may for example be obtained by digitizing analog signals, for example signals received from a microphone, but are not limited thereto. For example, the digital signals may also be digital data signals.

A thus obtained digital transmit signal is supplied to a mixing DAC 11 where the digital signal is converted to an analog signal, for example an analog current signal, and also mixed with a local oscillator (LO) signal. The local oscillator signal may for example be a radio frequency (RF) signal.

In an embodiment, mixing DAC 11 comprises a plurality of cells, each cell comprising its own associated mixer. In an embodiment, each cell may comprise a current source. In an embodiment, the local oscillator signal is selectively coupled to the individual mixers of the individual cells depending on the digital signal supplied by digital signal processing circuitry 10.

A thus obtained analog signal is output from mixing DAC 11 and supplied to an antenna 12 to be transmitted.

It should be noted that the simplified block diagram of FIG. 1 shows only some features of a transmitter, and additional elements, for example filters, amplifiers or the like, may be present in some embodiments.

Figure 2:
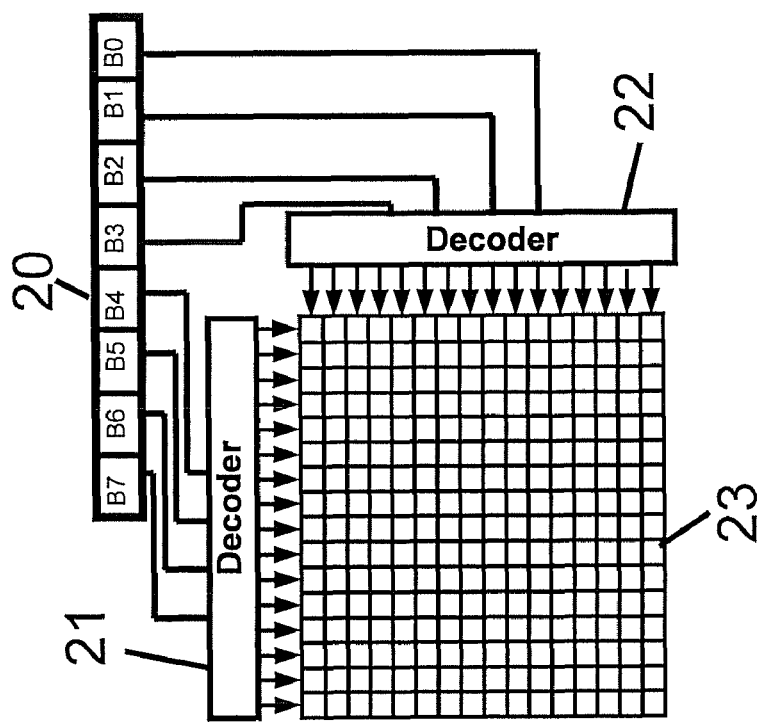
FIG. 2 shows a block diagram of portions of a digital to analog converter according to an embodiment.

Next, with reference to FIG. 2, an embodiment of a digital to analog converter according to the present invention is shown. The digital to analog converter of the embodiment of FIG. 2 is a so-called thermometer encoded digital to analog converter.

In the example embodiment of FIG. 2, an input 20 receives an eight bit signal, the bits being denoted B0 to B7 in FIG. 2. Bits B0 to B3 which may be the least significant four bits are fed to a thermometer decoder 22, while bits B4 to B7 are fed to a thermometer decoder 22. Thermometer decoders 22 and 21 control a cell array 23 which comprises $2^8-1$, i.e. 255, cells. Each cell when activated outputs the same output value, for example a predetermined current. The number of activated cells depends on the eight bit value B0 to B7. For example, if no bit is set corresponding to a (decimal) bit value of zero, no cell is activated so the output current is zero. On the other hand, if all bits are set corresponding to a decimal value of 255, all cells are activated to yield an output signal which essentially is 255 times stronger than the output of a single cell.

Figure 3:
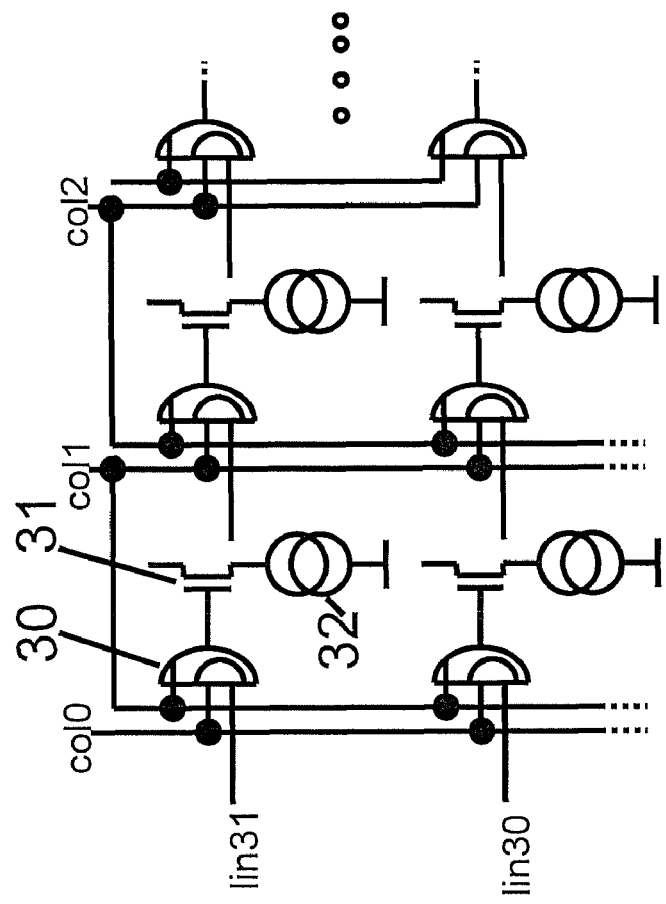
FIG. 3 shows a circuit diagram of a portion of a digital to analog converter according to an embodiment.

An example for a portion of cell array 23 is shown in FIG. 3.

In the example of FIG. 3 each cell comprises an ANDOR-gate 30, a transistor 31 acting as a switch and a current source 32 coupled between transistor 31 and ground. With "col" control lines arranged in columns and coupled to thermometer decoder 21 are denoted, while with "lin" control lines arranged in lines and coupled to thermometer decoder 22 are denoted. By setting the control lines, of which col0, col1 and col2 as well as lin31 and lin30 are shown in FIG. 3, to logic 1 or logic 0 by thermometer decoders 21, 22 of FIG. 2, cells may be selectively activated and deactivated.

As can be seen in FIG. 3, each ANDOR-gate 30 is coupled with two "col" lines and one "lin" line. For example, the ANDOR-gate bearing reference numeral 30 in FIG. 3 is coupled with col0, col1 and lin31. ANDOR-gate 30 links the "col" input with the lower number with the "lin" input using a logic AND and links the result with the "col" input with the higher number with a logic OR in the above example (col0 AND lin31) OR col1.

Therefore, when col0 and lin31, col1 or all inputs in the example of FIG. 3 are set to logic 1, ANDOR-gate 30 outputs a logic 1 switching transistor 31 to a conducting state between its source and drain terminals. In this case, the current of current source 32 contributes to the output of the digital to analog converter. On the other hand, if in the example of FIG. 1 one of col0, and lin31 is set to logic 0, and col1 is set to logic 0, ANDOR-gate 30 outputs a logic 0, switching transistor 31 to a non-conducting state between source and drain. In this case, current source 32 does not contribute to the output of DAC. Therefore, by controlling the "col" lines and the "lin" lines accordingly, the current sources or in other words the cells may be selectively activated or deactivated as described before. It is to be noted that the above-described control logic using ANDOR-gate 30 is only one example for a control logic, and other implementations are equally possible.

While with reference to FIGS. 2 and 3 an example for a fully thermometer encoded DAC has been shown, in other embodiments a DAC may only be partially thermometer decoded, or not thermometer encoded. For example, for a 10 bit DAC, the eight most significant bits may be thermometer encoded, using for example the structure of FIG. 2, and for the two least significant bits two additional cells may be provided, which for example may each comprise a current source and a transistor acting as a switch similar to the cells shown in FIG. 3. For the least significant bit, the current source may have a current output ¼ of the current output of each of current sources of an array of cells of the thermometer encoded portion, and for the second least significant bit the current output of the current source may be ½ the current of each of the current sources of the cells of the array of the thermometer encoded portion in an embodiment. The control transistors for these two cells are directly controlled by the bits, i.e., the least significant bit and the second least significant bit in the above example.

In other embodiments, the number of thermometer encoded bits and non-thermometer encoded bits may vary. On the other hand, all bits may be non-thermometer encoded. In this case, for example for an eight bit DAC eight cells may be provided, each comprising a current source, the ratio of the output currents of the current sources being for example 1:2:4:8: . . . :128, each cell being controlled by one of the bits.

In embodiments of the present invention, each cell of a DAC comprises a mixer, which is not shown in FIG. 3, but examples for which will be explained below with reference to FIGS. 4 to 7. In other embodiments, only cells of a thermometer encoded portion may have their own assigned mixer each, and cells of a non-thermometer encoded portion may have a common mixer.

Throughout FIGS. 4 to 7, in order to avoid unnecessary repetitions, similar or like elements are bearing the same reference numeral and will not be described repeatedly. However, it should be noted that elements bearing the same reference numerals, while having the same general function, are not necessarily identical.

Figure 4:
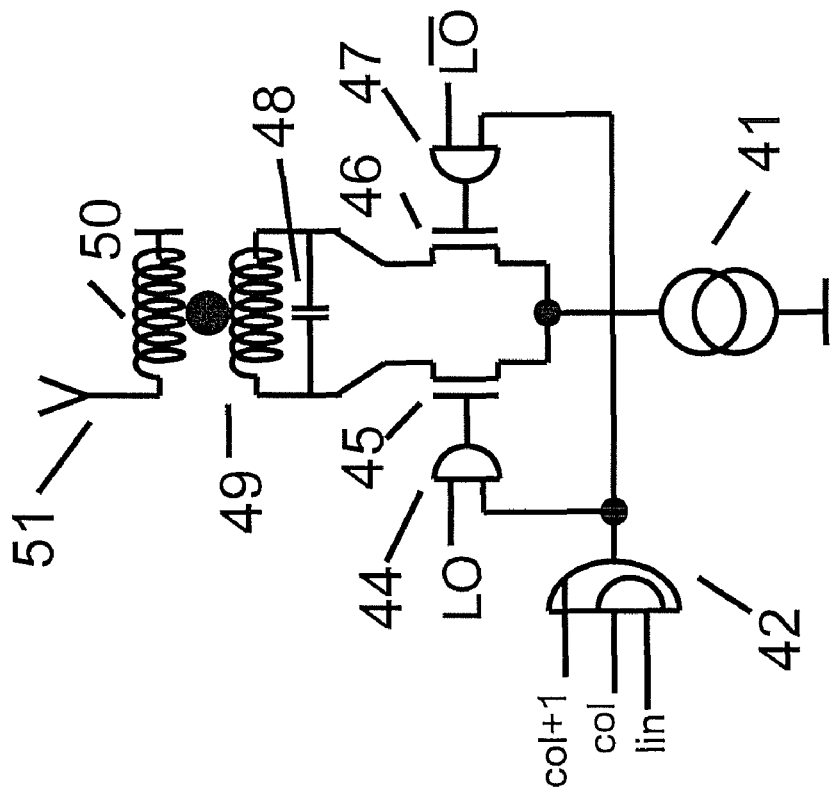
FIG. 4 shows a circuit diagram of a cell of a digital to analog converter according to an embodiment.

In FIG. 4, an embodiment of an DAC cell is shown. The DAC cell of the embodiment of FIG. 4 may for example be a cell of the array of cell 23 of FIG. 2, but is not limited thereto.

In the embodiment of FIG. 4, a current source 41, a transistor 43 and an ANDOR-gate 42 are provided. Current source 41 is coupled between transistor 43 and ground, and an output of ANDOR-gate 42 is coupled to a gate terminal of transistor 43 such that transistor 43 is switched between a conducting state and a non-conducting state depending on the output of ANDOR-gate 42. In other words, in case of MOS transistors as shown the gate terminal serves as control terminal of the transistor. Similar to what was explained with reference to FIG. 3, ANDOR-gate 42 comprises three inputs, one of a "lin" line and two from adjacent "col" lines. The output of ANDOR-gate 42 corresponds to (lin AND col) OR col+1. Therefore, the function of current source 41, ANDOR-gate 42 and transistor 43 correspond to the functions of element 30, 31 and 32 of FIG. 3. In other implementations, other logic gates and logic circuits may be used instead of ANDOR-gate 42.

A second terminal of transistor 43 is coupled with a mixer, which in the embodiment of FIG. 2 comprises two transistors 45, 46 acting as switches. A gate terminal of transistor 45 is coupled with an output of an AND-gate 44, and a gate terminal of transistor 46 is coupled with an output of an AND-gate 47.

A first input of AND-gate 44 is coupled with a local oscillator signal LO, and a second input of AND-gate 44 is coupled with the output of ANDOR-gate 42. A first input of AND-gate 47 receives the local oscillator signal in inverted form, denoted with $\overline{LO}$ in FIG. 4, and a second input of AND-gate 47 is coupled with the output of ANDOR-gate 42.

Therefore, if the cell shown in FIG. 4 is not activated, i.e., ANDOR-gate 42 outputs a logic 0, AND-gates 44 and irrespective of the state of the local oscillator signal output a logic 0 and therefore set transistors 45, 46 to a non-conducting state. Therefore, in the embodiment of FIG. 4 AND-gates 44, 47 act as switching circuitry decoupling the local oscillator signal from the mixer when the cell is deactivated, which in turn is based on an input digital signal of the respective digital to analog converter.

On the other hand, when the cell of FIG. 4 is activated, transistor 43 is conducting, thus supplying the current from current source 41 to the mixer, i.e., transistors 45 and 46. In this case, when the local oscillator signal LO is logic 1, transistor 45 is conducting and transistor 46 is non-conducting (as $\overline{LO}$ is logic 0), and when the local oscillator signal is logic 0, $\overline{LO}$ is logic 1 and thus transistor 45 is non-conducting and transistor 46 is conducting. Therefore, the current 41 is switched between transistor 45 and transistor 46 and thus mixed with the frequency of the local oscillator signal.

The output of the cell, i.e. transistors 45 and 46, are coupled with a transformer comprising an inductivity 49 and a capacitance 48 on a side of the cell and a inductance 50 on a side of an antenna 51. It should be noted that elements 48 to 51 are not part of the cell, but merely serve as an example for elements to which the output of the cell may be coupled. It should also be noted that in some embodiments all cells of a digital to analog converter are coupled to elements 48 to 51. In other embodiments, further (not shown) elements may be provided between the cells and elements 48 to 51 or other elements for which the signal of the digital to analog converter is intended.

Figure 5:
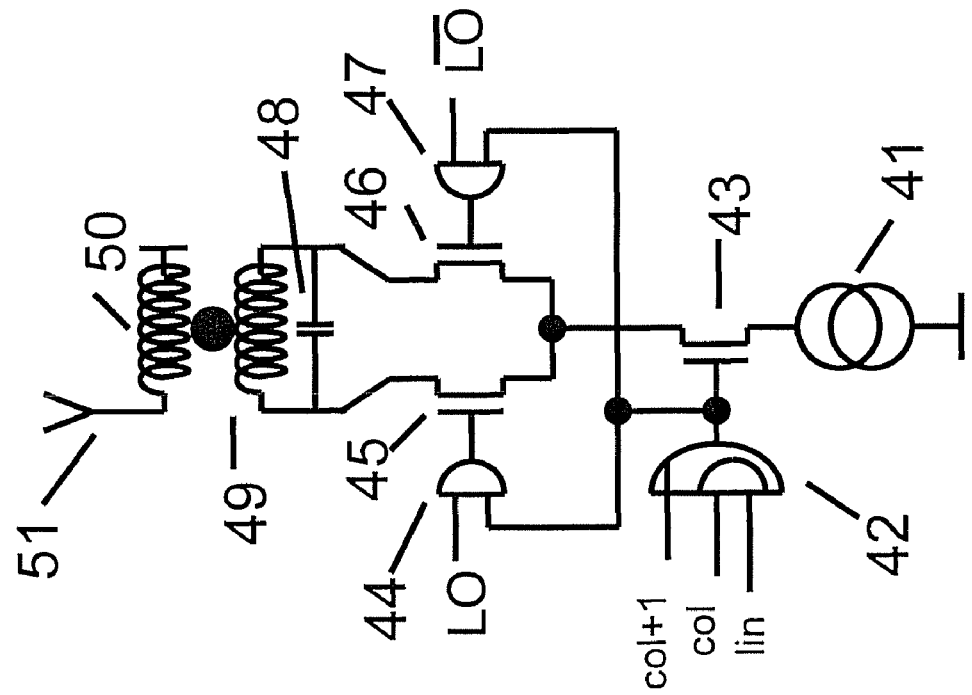
FIG. 5 shows a circuit diagram of a cell of a digital to analog converter according to an embodiment.

In FIG. 5, a further cell of a DAC according to an embodiment is shown. Compared to the embodiment of FIG. 4, transistor 43 is omitted. It should be noted that as when ANDOR-gate 42 outputs a logic 0, AND-gates 44 and 47 also output a logic 0 therefore switching transistors 45 and 46 to a non-conducting state, also in this case current source 41 is decoupled from the output of the cell when the cell is not activated. Otherwise, the embodiment of FIG. 5 corresponds to the embodiment of FIG. 4 and will not be described again.

Figures 6, 7:
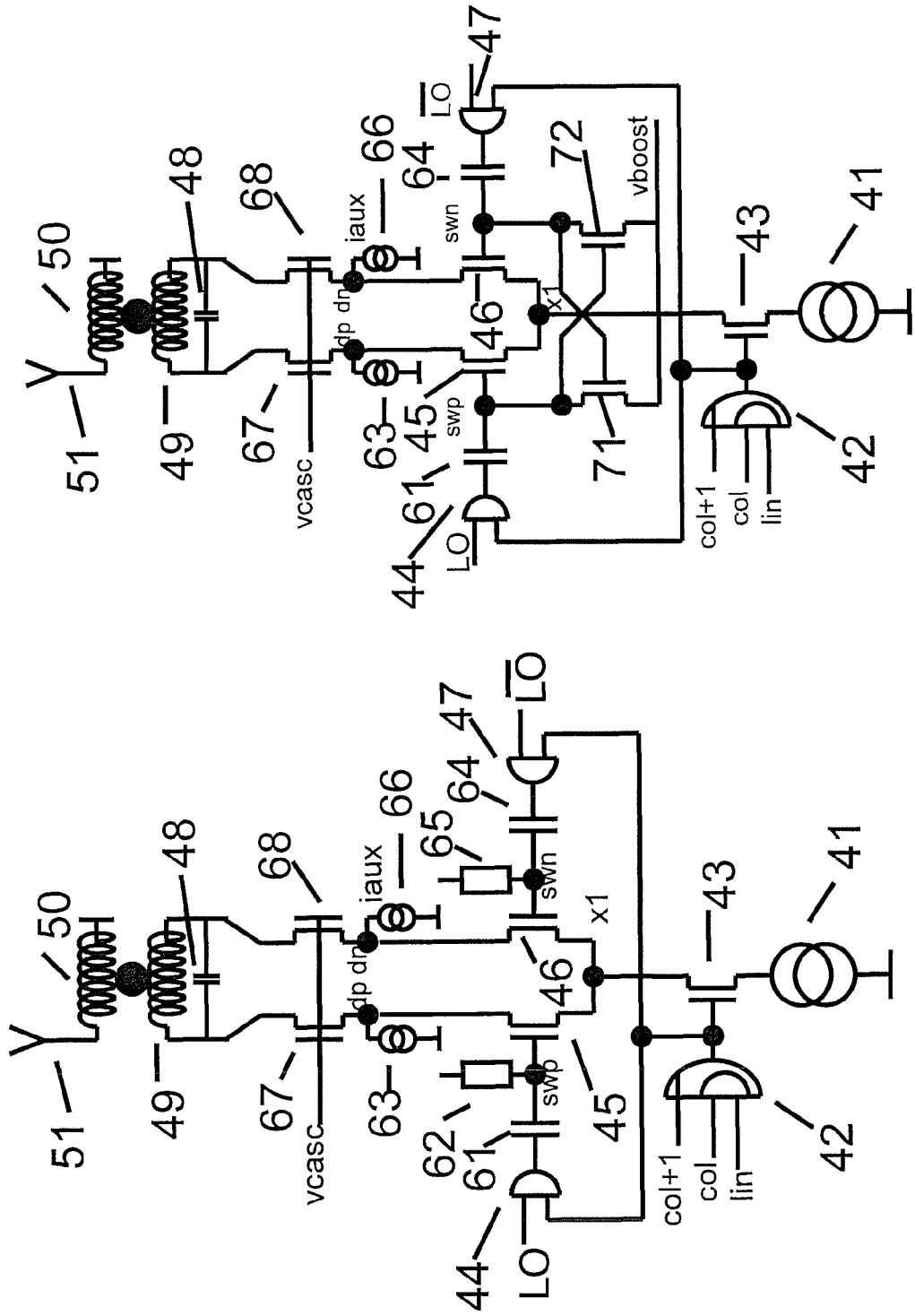
FIG. 6 shows a circuit diagram of a cell of a digital to analog converter according to an embodiment.
FIG. 7 shows a circuit diagram of a cell of a digital to analog converter according to an embodiment.

In FIG. 6, a cell of a DAC according to a further embodiment is shown. The essential operation of cell of FIG. 6 corresponds to the cell of FIG. 4, and elements common to FIG. 6 and FIG. 4 which bear the same reference numeral will not be described again in detail. In the embodiment of FIG. 6, AND-gates 44 and 47 are coupled with the gate terminals of transistors 45, 46 via capacitances 61, 64, respectively, and resistors 62, 65 are coupled to nodes swp, swn between capacitor 61 and transistor 45 and capacitor 64 and transistor 46, respectively. Via resistors 62, 65 an average value for the gate voltage of transistors 45, 46 may be set, which is then modified by the local oscillator signal via capacitances 61, 64 when the cell is active, i.e. ANDOR-gate 42 outputs a logic 1.

Furthermore, cascode transistors 67, 68 are provided at the output of the mixer of the embodiment of FIG. 6 biased by a cascode voltage vcasc. A node dp between transistor 45 and cascode transistor 67 is charged by an auxiliary current source 63 with an auxiliary current iaux, and a node dn between transistor 46 and cascode transistor 68 is charged by an auxiliary current source 66 with a current iaux.

Capacitance 61 and resistor 62 on the one hand and capacitor 64 and resistor 65 on the other hand each form a high pass filter for "boosting" nodes swp, swn, respectively. Through the current iaux and the embodiment of FIG. 6 nodes dp, dn can be charged approximately to a predetermined voltage when both transistors 45, 46 are switched off.

It should be noted that cascode transistor 67, 68 and current sources 63, 66 may be part of each cell in an embodiment, but in other embodiments also may be implemented external to the cell as elements common to all cells or elements common to a part of the cells.

A voltage to which nodes swp, swn are set via resistor 62, 65 may be approximately at or slightly below a voltage at a node x1 in an embodiment.

A further cell of a DAC according to an embodiment is shown in FIG. 7. Compared to the embodiment of FIG. 6, in the embodiment of FIG. 7 resistors 62, 65 are omitted and nodes swp, swn are "boosted" via a pair of cross-coupled transistors 71, 72 which is coupled between nodes swp, swn and a voltage vboost. In this way, swp and swn may for example be set to vboost+VDD or to vboost, VDD being a positive supply voltage, thus setting an upper limit of the "swing", i.e. voltage range, at the gates of transistors 45, 46. Otherwise, the operation and elements of the embodiments of FIG. 7 correspond to FIG. 6 and will not be described again.

While a plurality of different embodiments has been described with reference to the figures, the present invention is not limited to these embodiments, as a plurality of modifications is possible without departing from the scope of the present invention. Some examples for such modifications will be described below.

While in FIGS. 6 and 7 a transistor 43 is provided, transistor 43 may also be omitted, similar to the embodiment of FIG. 5.

While in the embodiments of FIGS. 4 to 7 the local oscillator signal and its inverse are coupled to the mixer via AND-gates 44, 47, in other embodiments these AND-gates may be omitted. In still other embodiments instead of using an AND-gate, a switch controlled by a signal activating and deactivating the cell, for example the output of ANDOR-gate 42, may be provided between an input for the local oscillator signal and/or its inverse $\overline{LO}$ and the mixer. A transistor, the gate of which is coupled to ANDOR-gate 42, may be used as such a switch in some embodiments.

While in the embodiment a specific logic involving ANDOR-gate 42 has been described for controlling the cells, the present invention is not limited thereto. Generally, the cells of the embodiments of FIG. 4 to FIG. 7 may be activated by supplying a logic 1 to a node corresponding to the output of ANDOR-gate 42, and deactivated by applying a logic 0 to this node. The specific gates or controllers like thermometer decoders used for activation and deactivation depend on the specific implementation. For example, if cells like the ones of FIG. 4 to FIG. 7 are used for non-thermometer encoded bits, the respective bit may be directly applied to the above mentioned node corresponding to the output of ANDOR-gate 42 in the figures.

It should also be noted that in FIGS. 4 to 7 NMOS transistors have been depicted which are put to a conducting state when a logic 1 is supplied and a non-conducting state between source and reign when a logic 0 is supplied. In another embodiment, the control logic may be reversed, and PMOS transistors may be used. In still other embodiments, PMOS transistors may be used instead of NMOS transistors in cases where for example logic 1 is associated with a low voltage and logic 0 is associated with a high voltage. In still other embodiments, instead of some or all of the MOS transistors shown other types of transistors, for example bipolar transistors, may be used. For example, in case of bipolar transistors a base terminal serves as control terminal.

As can be seen, a plurality of variations and modifications are possible, and therefore the scope of the present application is intended to be limited only by the appended claims and equivalents thereof.

What is claimed is:

1. A digital to analog converter comprising:
   a digital signal input,
   a plurality of cells, each cell comprising a mixer, and
   coupling circuitry configured to selectively couple a local oscillator signal to each of said mixers based on a signal at said digital signal input.

2. The digital to analog converter of claim 1, wherein each cell comprises a current source coupled to said mixer.

3. The digital to analog converter of claim 2, wherein at least one of said cells comprises a switch provided between the respective current source of the cell and the respective mixer of the cell, a control input of said switch being coupled to said digital signal input.

4. The digital to analog converter of claim 1, wherein said coupling circuitry comprises an AND-gate, wherein a first input of said AND-gate is coupled to a local oscillator and a second input of said AND-gate is coupled with said digital signal input.

5. The digital to analog converter of claim 1, further comprising a thermometer decoder coupled between said digital signal input and at least a part of said plurality of cells.

6. The digital to analog converter of claim 1, wherein each of said mixers comprises a pair of transistors.

7. The digital to analog converter of claim 6, wherein at least one of said cells comprises boosting circuitry to boost nodes corresponding to control terminals of said pair of transistors to a predetermined voltage.

8. The digital to analog converter of claim 1, wherein at least one of said cells comprises a current source coupled to an output node of the mixer of the at least one of said cells.

9. A digital to analog converter comprising:
   a plurality of current sources,
   a plurality of mixers, each of said mixers being coupled with one of said current sources,
   a plurality of coupling circuitries, each coupling circuitry being associated with one of said mixers, and input of said coupling circuitry being coupled with a local oscillator signal, an output of said coupling circuitry being coupled with the respective associated mixer and a control input of said coupling circuitry being coupled with a digital signal input of said digital to analog converter.

10. The digital to analog converter of claim 9,
    wherein two coupling circuitries of said plurality of coupling circuitries are associated with each mixer of said plurality of mixers, one of said coupling circuitries for receiving said local oscillator signal and another one of said coupling circuitries for receiving an inverted version of said local oscillator signal.

11. The digital to analog converter of claim 9, further comprising a plurality of capacitances, each of said capacitances being coupled between one of said coupling circuitries and one of said mixers.

12. The digital to analog converter of claim 9, wherein at least a part of said plurality of current sources has a same nominal output current.

13. A digital to analog converter cell, comprising:
    a control input,
    a local oscillator input,
    an inverted local oscillator input,
    a current source,
    a first transistor, wherein a first terminal of said transistor is coupled with said current source, wherein a second terminal of said first transistor is coupled with an output node of said cell, and wherein a control input of said first transistor is coupled with an output of a first coupling circuit, wherein a first input of said first coupling circuit is coupled with said local oscillator input and wherein a second input of said first coupling circuit is coupled with said control input of said cell, and
    a second transistor, wherein a first terminal of said transistor is coupled with said current source, wherein a second terminal of said second transistor is coupled with an output node of said cell, and wherein a control input of said second transistor is coupled with an output of a second coupling circuit, wherein a first input of said second coupling circuit is coupled with said inverted oscillator input and wherein a second input of said second coupling circuit is coupled with said control input of said cell.

14. The cell of claim 13, wherein said first coupling circuit comprises an AND-gate, and wherein said second coupling circuit comprises an AND-gate.

15. The cell of claim 13,
    further comprising a third transistor, wherein a first terminal of said third transistor is coupled with said current source, wherein a second terminal of said third transistor is coupled with said first terminal of said first transistor and said first terminal of said second transistor, and wherein a control terminal of said third transistor is coupled with said control input of said cell.

16. The cell of claim 13, further comprising a logic gate, wherein an output of said logic gate is coupled with said control input of said cell and wherein at least one input of said logic gate is coupled with a control line of an array of cells.

17. The cell of claim 13, further comprising a first capacitor coupled between said first control circuit and said control input of said first transistor and a second capacitor coupled between said second coupling circuit and said control input of said second transistor.

18. The cell of claim 17, further comprising a first resistor, a terminal of said first resistor being coupled between said first capacitor and said control terminal of said first transistor, and
    a second resistor, a terminal of said second resistor being coupled between said second capacitor and said control terminal of said second transistor.

19. The cell of claim 17, further comprising:
    a fourth transistor, and
    a fifth transistor,
    wherein a first terminal of said fourth transistor is coupled with a node between said first capacitor and said control input of said first transistor and with a control terminal of said fifth transistor, wherein a first terminal of said fifth transistor is coupled with a node between said second capacitor and said control terminal of said second transistor and with a control terminal of said fourth transistor,
    wherein a second terminal of said fourth transistor and a second terminal of said fifth transistor is coupled with a predetermined voltage.

20. The cell of claim 19, wherein said predetermined voltage essentially corresponds to a voltage at said first terminal of said first transistor and said first terminal of said second transistor.

21. A transmitter, comprising:
digital signal processing circuitry to generate a digital transmit signal,
a digital to analog converter to convert said digital transmit signal to an analog transmit signal, wherein said digital to analog converter comprises a plurality of cells, each cell comprising a mixer configured to generate a portion of said analog transmit signal mixed with a local oscillator signal,
at least one of said cells comprises a switch provided between a current source of the cell and the mixer of the at least one of said cells, a control input of said switch being coupled to a digital signal, and
an antenna to receive said analog transmit signal.

22. The transmitter of claim 21, wherein each of said cell comprises a current source, each of said current sources having the same nominal output current.

23. A method, comprising:
receiving a digital input signal, and
selectively coupling a local oscillator signal to a plurality of mixers based on said digital input signal.

24. The method of claim 23, further comprising:
selectively coupling an associated one of a plurality of current sources with each of said mixers based on said digital input signal.

25. The method of claim 23, further comprising supplying a current to an output node of each of said mixers.

* * * * *